United States Patent [19]

Hoang

[11] Patent Number: 5,216,295

[45] Date of Patent: Jun. 1, 1993

[54] CURRENT MODE LOGIC CIRCUITS EMPLOYING IGFETS

[75] Inventor: Chinh L. Hoang, San Diego, Calif.

[73] Assignee: General Instrument Corp., Hatboro, Pa.

[21] Appl. No.: 753,444

[22] Filed: Aug. 30, 1991

[51] Int. Cl.[5] .......................................... H03K 19/094
[52] U.S. Cl. ................... 307/451; 307/452; 307/453; 307/465
[58] Field of Search ............... 307/451, 448, 452, 453, 307/465

[56] References Cited

U.S. PATENT DOCUMENTS

| | | | |
|---|---|---|---|
| 4,812,676 | 3/1989 | Yang et al. | 307/290 |
| 4,825,098 | 4/1989 | Aoyama | 307/465 |
| 4,858,191 | 8/1989 | Higuchi et al. | 365/154 X |

OTHER PUBLICATIONS

Heimsch et al.; Merged CMOS/Bipolar Current Switch Logic(MCSL); Journal of Solid State Circuits, vol. 24, No. 5, Oct., 1989; p. 1307.
Hong-Ih Cong et al.; Multigigahertz CMOS Dual-Modulus Prescalar IC: Journal of Solid State Circuits, vol. 23, No. 5, Oct., 1988; p. 1189.

Primary Examiner—Paul M. Dzierzynski
Assistant Examiner—R. A. Ratliff
Attorney, Agent, or Firm—Henry I. Schanzer; Michael Y. Epstein; Allan J. Jacobson

[57] ABSTRACT

Counting and division circuits include an input differential stage connected to a cross-coupled differential stage. The input stage includes first and second IGFETS whose gate electrodes are respectively connected to first and second inputs, whose drains are respectively connected to first and second outputs, and whose sources are connected to the drain of a third IGFET whose source is grounded. The cross-coupled stage includes fourth and fifth IGFETs which are cross-coupled in that the gate of the fourth IGFET and the drain of the fifth IGFET are directly connected to the first output and the gate of the fifth IGFET and the drain of the fourth IGFET are directly connected to the second output. The sources of the fourth and fifth IGFETs are connected in common to the drain of a sixth IGFET whose source is grounded. Control signals are applied to the gates of the third and sixth IGFETS for selectively and alternately turning them on one at a time and, simultaneously, setting the level of the current flowing through the differentially connected IGFETS in their drain circuit.

11 Claims, 8 Drawing Sheets

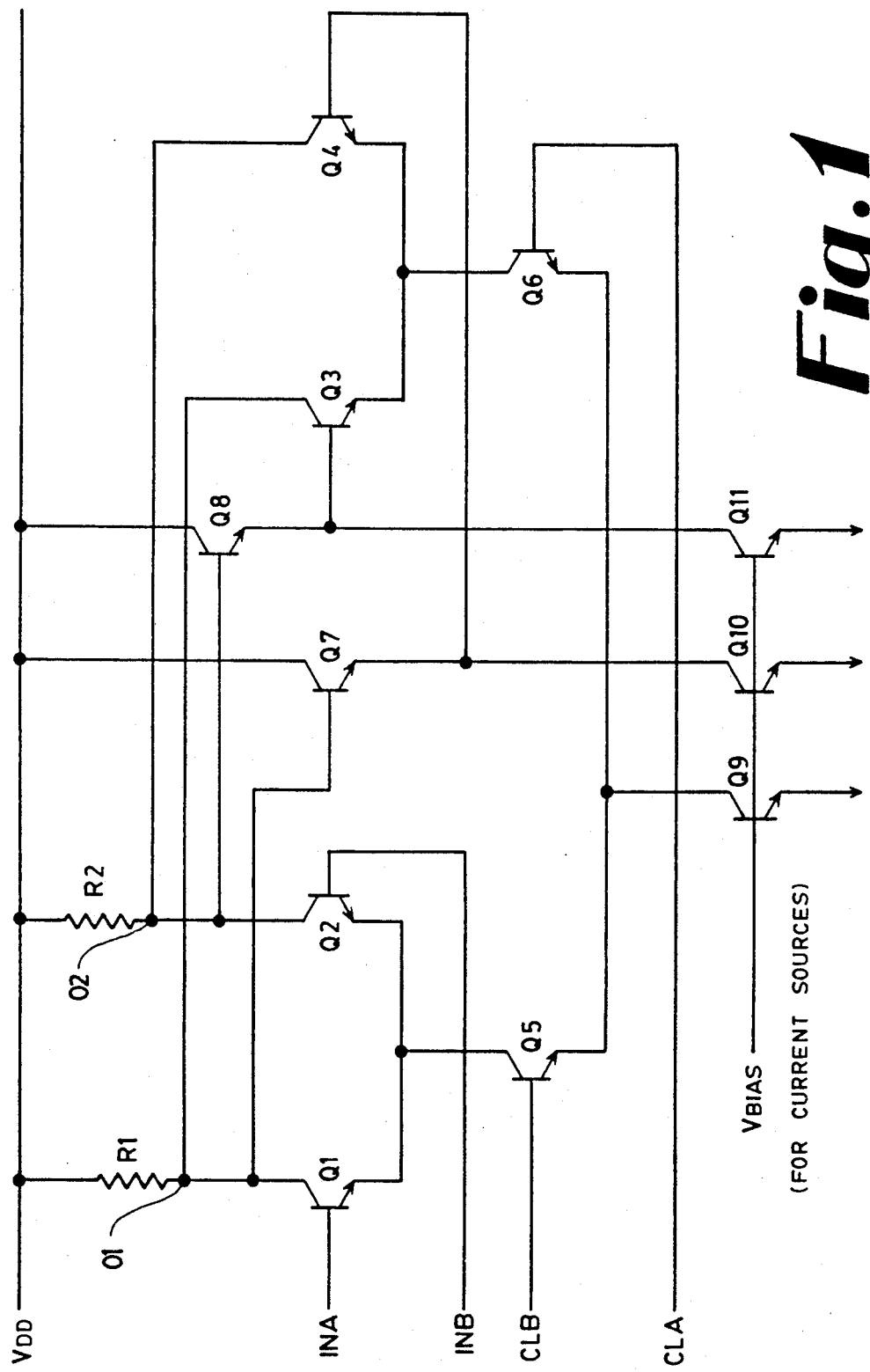

DIVIDE-BY-FOUR COUNTER

CURRENT MODE LOGIC CIRCUITS EMPLOYING IGFETS

BACKGROUND OF THE INVENTION

This invention relates to logic circuitry and in particular to current mode logic (CML) circuits employing metal oxide semiconductor (MOS) devices.

In many applications, such as TV systems, high speed counters are a key element. Current-mode logic (CML) circuits employing bipolar transistors for forming high speed counters are known. One stage of such a bipolar transistor current-mode logic (CML) circuit which can be used to perform various counting functions is shown in the Prior Art circuit of FIG. 1.

The circuit of FIG. 1 includes a first differentially connected input stage comprised of transistors Q1, Q2, and Q5 having complementary inputs INA and INB and complementary outputs O1 and O2. The outputs O1 and O2 are respectively coupled via level shift transistors Q7 and Q8 to produce the actual outputs applied to the bases of Q4 and Q3 which function as the inputs of a second differentially connected cross-coupled stage comprised of Q3, Q4, and Q6. The collectors of Q3 and Q4 are respectively connected to outputs O1 and O2 whereby Q3 and Q4 are cross-coupled and function as a latch when Q6 is turned-on.

The outputs O1 and O2 are coupled via resistors R1 and R2, respectively, to the positive supply VDD. The emitters of transistors Q5 and Q6 are connected to the collector of a current source transistor Q9 and the emitters of Q7 and Q8 are respectively connected to the collectors of current source transistors Q10 and Q11. A bias voltage Vbias is applied to the bases of Q9, Q10, and Q11, whereby these transistors function as relatively constant current sources.

Complementary clock signals CLA and CLB are applied to the bases of transistors Q6 and Q5, respectively, to control the turn-on and turn-off of these transistors. When CLB is "high" and CLA is "low", Q6 is OFF while Q5 is ON and couples current source Q9 to the emitters of Q1 and Q2. When CLA is "high" and CLB is "low", Q5 is OFF while Q6 is ON and couples current source Q9 to the emitters of Q3 and Q4.

In the operation of the circuit, when CLB is "high" the differential input stage is enabled and is responsive to the input data, INA and INB, to produce corresponding signals at the outputs O1 and O2. That is, when INA is "high" and INB is "low" the output O1 is "low" and the output O2 is "high" and when INA is "low" and INB is "high", the output O1 is "high" and O2 is "low". When CLA is "high" and CLB is "low" the differential input stage is disabled while the cross-coupled stage is enabled and stores the information generated at the outputs O1 and O2 when the preceding CLB signal was "high". Thus when CLB is "high", input data is acquired by the differential input stage and during the succeeding phase when CLA is "high", the data is stored (i.e., latched) in the cross-coupled differential stage for subsequent transfer and/or application to other stages.

The circuit of FIG. 1 may be used to perform many desirable functions. However, the circuit suffers from some significant drawbacks.

For example, the circuit of FIG. 1 requires the use of at least one transistor Q9 to form a current source and additional peripheral circuitry (not shown) to generate a bias voltage for Q9 to ensure the proper operation of Q9. In addition, the use of transistor Q9 introduces a third level in series with the level of the differentially connected transistors (Q1, Q2) and the level of switch Q5. The presence of the third level (i.e. Q9) complicates the biasing of the stage and the range of the signal swing at the stage output.

Also, the amplitude of the clock signals CLA and CLB applied to the bases of Q5 and Q6 must be within a prescribed range. Otherwise, Q5 and Q6 will be driven into saturation obviating the high speed advantage of the circuit. Hence in the cicuit of FIG. 1, the amplitude of the clock signals must be carefully limited imposing severe constraints on the clock generating circuit.

Furthermore, the outputs O1 and O2 must be coupled via level shift transistors (Q7,Q8) to step down the signal swing to provide an appropriate interface with the next differential stage present at the bases of transistors Q3,Q4. This requires that the circuit includes level shift transistors Q7, Q8 and their associated current source transistors Q10, Q11. Still further, the circuit of FIG. 1 includes resistors R1, R2 which have to be high quality, well matched components. This places a burden on the process since R1 and R2 are non-standard components.

The disadvantages discussed above are overcome in circuits embodying the invention by employing insulated-gate field-effect transistors (IGFETs). Circuits embodying the invention enable a very high frequency operation not achievable using standard complementary MOS Logic circuits.

SUMMARY OF THE INVENTION

Circuits embodying the invention include an input differential stage connected to a cross-coupled differential stage. The input stage includes first and second IGFETS whose control electrodes are respectively connected to first and second inputs, whose drains are respectively connected to first and second outputs, and whose sources are connected to the drain of a third IGFET whose source is returned to a point of operating potential. The cross-coupled stage includes fourth and fifth IGFETs which are cross-coupled in that the control electrode of the fourth IGFET and the drain of the fifth IGFET are directly connected to the first output and the control electrode of the fifth IGFET and the drain of the fourth IGFET are directly connected to the second output. The sources of the fourth and fifth IGFETs are connected in common to the drain of a sixth IGFET whose source is returned to a point of operating potential. Control signals are applied to the control electrodes of the third and sixth IGFETS for selectively and alternately turning them on one at a time and simultaneously setting the level of the current flowing through the differentially connected IGFETS in their drain circuit.

Thus, in circuits embodying the invention there is no need for separate current source transistors and for circuitry to generate bias voltages. Also, in circuits embodying the invention the need for level shifting transistors and their associated current sources is eliminated enabling the inputs/outputs of the cross-coupled differential stage to be directly connected to the outputs of the differential input stage. In addition, as discussed below, the control signals may have a wide range o amplitude without adversely limiting the operation of the circuit.

In a preferred embodiment, IGFETs of complementary conductivity type are connected between a power terminal and the first and second outputs to provide effective loads between the power terminal and the outputs, eliminating the need for non-standard, high-quality, well-matched resistors.

BRIEF DESCRIPTION OF THE DRAWING

In the accompanying drawing like reference characters denote like components, and FIG. 1 is a schematic diagram of a Prior Art current mode logic (CML) circuit employing bipolar transistors;

DETAILED DESCRIPTION OF THE INVENTION

Figure 2A:
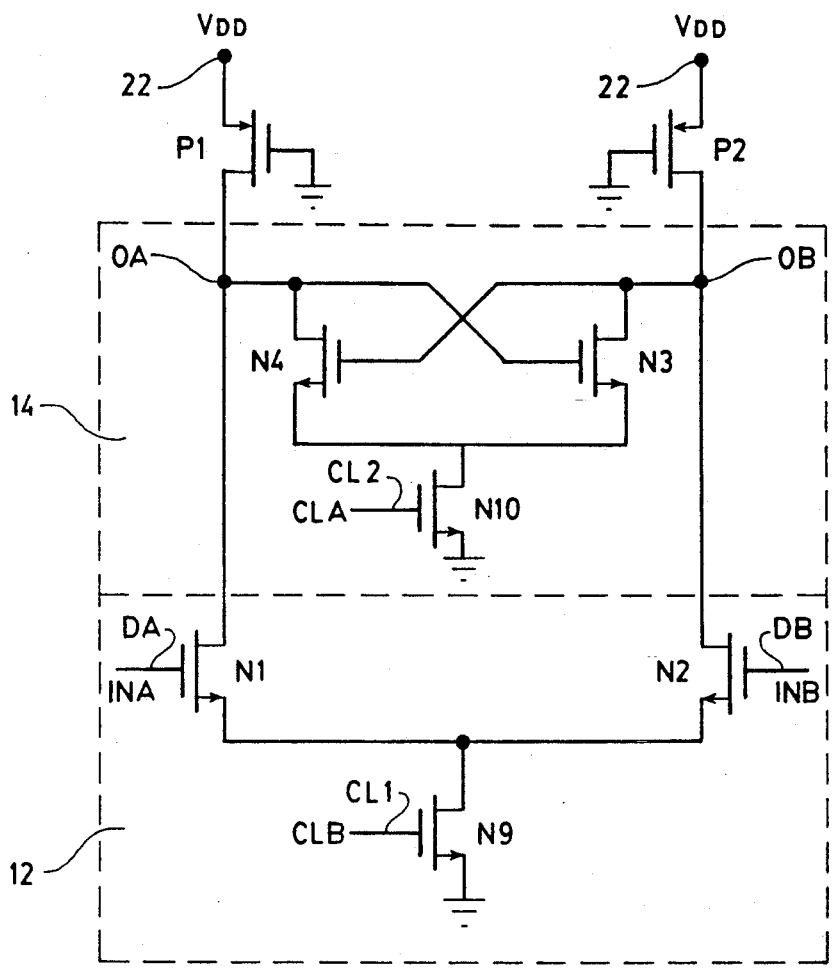
FIG. 2A is a schematic diagram of a current mode logic (CML) circuit embodying the invention.

Insulated-gate field-effect transistors (IGFETs) are the active devices preferred for use in practicing the invention. For this reason, the circuit is illustrated in the drawing as employing such transistors and will be so described hereinafter.

In the FIGURES, enhancement type IGFETs of P conductivity type are identified by the letter P followed by a particular reference character; and enhancement type IGFETs of N-conductivity type are identified by the letter N followed by a particular reference character. The characteristics of IGFETs are well known and need not be described in detail. But, for a clearer understanding of the description to follow, definition and characteristics of IGFETs pertinent to the invention are set forth below.

1. IGFETs have a first electrode and a second electrode referred to as the source and drain defining the ends of a conduction path, and a control electrode (gate) whose applied potential determines the conductivity of the conduction path. For a P-type IGFET the source electrode is defined as that electrode of the first and second electrodes having the highest potential applied thereto. For an N-type IGFET, the source electrode is defined as that electrode of the first and second electrodes having the lowest potential applied thereto.

2. The devices used are bidirectional in the sense that when an enabling signal is applied to the control electrode, current can flow in either direction in the conduction path defined by the first and second electrodes 3. For conduction to occur, the applied gate-to-source potential (Vgs) must be in a direction to turn-on the transistor and must be greater in magnitude than a given value which is defined as the threshold voltage (Vt). Thus, where the applied Vgs is in a direction to turn-on the transistor but is lower in amplitude than Vt the transistor remains cut off and there is substantially no current flow in the conduction channel.

4. When used as a source follower, the voltage at the source electrode (Vs) "follows" the signal applied at the gate (Vg) but is offset with respect to the gate by a voltage whose amplitude is equal to the effective threshold voltage of the device.

Referring to FIG. 2A, there is shown a clocked differentially connected input stage 12 and a clocked differentially connected cross-coupled stage 14. The differential input stage 12 is operable during one phase of a clock signal (e.g. Clock B or CLB) and the cross-coupled stage 14 is operable during another phase of the clock (e.g. Clock A or CLA).

The differential input stage 12 includes IGFETS N1, N2 and N9. The source electrodes of N1 and N2 are connected in common to the drain electrode of N9 whose source is grounded. The drain of N1 is connected to output node OA and the drain of N2 is connected to node OB. An input signal INA is applied to the gate electrode of N1 at DA, an input signal INB is applied to the gate electrode of N2 at DB, and a clock signal, CLB, is applied to the gate electrode of N9.

The cross-coupled differential stage 14 includes IGFETS N3, N4 and N10. The source electrodes of N3 and N4 are connected in common to the drain electrode of N10 whose source is grounded. The gate of N3 and the drain of N4 are directly connected to output node OA and the gate of N4 and the drain of N3 are directly connected to output node OB. A clock signal CLA is applied to the gate electrode of N10.

The conduction paths of IGFETS P1 and P2 which function as load devices are connected between output nodes OA and OB, respectively, and a power terminal 22 to which is applied a potential VDD, which is positive with respect to ground. The gate electrodes of P1 and P2 are returned to ground whereby P1 and P2 function as current sources into output nodes OA and OB. P1 and P2 function as the loads to both stages 12 and 14. That is, when CLB is "high", P1 and P2 are the loads for stage 12 and when CLA is "high", P1 and P2 are the loads for stage 14.

For ease of explanation, assume that CLA and CLB are complementary signals. The amplitude of the clock signals (CLA, CLB) is assumed to swing between ground, defined as "low" or logic "0" and VDD, defined as "high" or logic "1". However, the amplitude of CLA and CLB is not critical so long as when "high", it is sufficientlly high to turn-on N9 or N10 and when "low", it is sufficiently low to turn-off N9 or N10.

Before discussing the operation of the circuit of FIG. 2A in detail, note that due to the differential connection of stage 12 (or 14), the amplitude of the input signals need not swing between VDD and ground. It is sufficient that INA be either more positive or more negative than INB by some amount to provide rapid and reliable current switching in the differential stage. Note also that the value of voltage produced at OA or OB for a "low" condition, may range from several millivolts to several volts below VDD; the actual value being a function of the currents and sizes of all the transistors forming the differential stage. The value of voltage produced at OA or OB for a "high" condition will be close to VDD volts. The critical point is the production of complementary signals (i.e. a high and a low) at OA and OB which are of sufficient amplitude when applied to other differentially connected stages to produce switching.

The operation of the circuit of FIG. 2A may be explained as follows: When the signal CLB is "high", the signal CLA is "low". When CLB is high, stage 12 is enabled and N1 and N2 can conduct. If the input signal at DA is more positive than the input signal at DB (and the input signal at DA is also more positive than the threshold voltage of N1) N1 is turned on and conducts causing the output at the node OA to go "low". For this condition, N2 is turned-off and does not conduct and the output signal at node OB goes "high" towards VDD via the conduction path of P2. If, on the other hand, the input signal at DB is more positive than that at DA (and assume also that the input signal at DB is more positive than the threshold voltage of N2) N2 is turned on and conducts causing OB to go low. At the same time, N1 is turned-off and OA goes "high" via the conduction path of P1. Thus when CLB is high, the input signal condition at DA and DB is transferred to the outputs (OA,OB) of the differential input stage.

When CLB is high and CLA is low, cross coupled stage 14 is disabled. When CLA is low, N10 is turned-off and no conduction can take place via N3 and N4 to ground. When CLA goes high, N10 is turned on and the cross-coupled latch formed by N3 and N4 is enabled. For the condition of OA being high and OB being low (i.e., OA is more positive than OB) N3 is turned on clamping OB to a low level, whereby N4 is turned-off and OA remains high and OB low. For the condition of OB being high, and OA being low (i.e., OB is more positive than OA) N4 is turned-on and clamps OA "low" whereby N3 is turned-off and OB remains high. Thus when CLA goes high the cross coupled stage functions as a latch and stores the condition existing at OA and OB, just prior to the latch being enabled.

Thus, the circuit of FIG. 2A enables the transfer of information from the input to the output of the differential input stage 12 during one phase of a clock signal and the storing (latching) of that information during a succeeding phase of the clock signal.

Figure 2B:
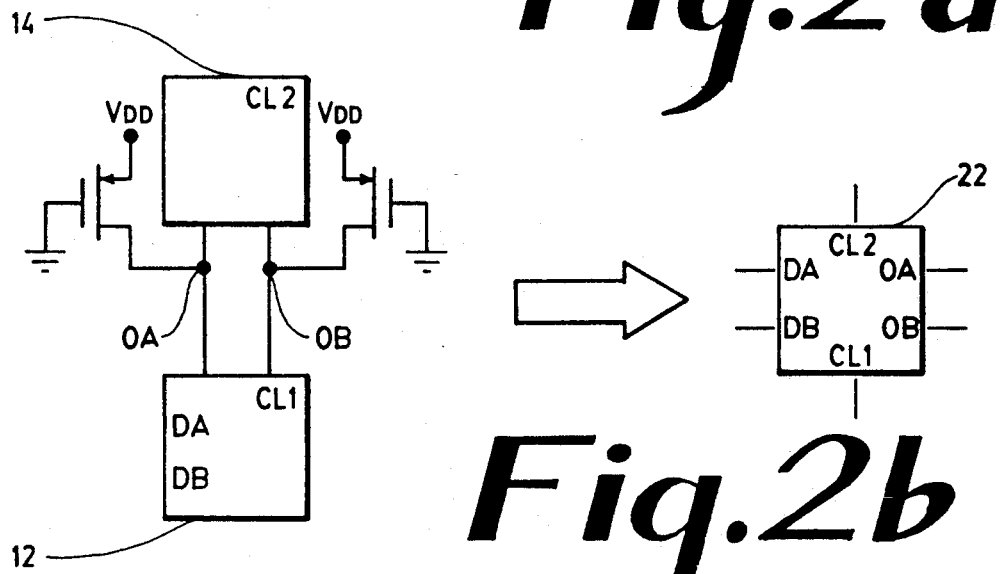
FIG. 2B is a block diagram representation of the circuit of FIG. 2A.

In contrast to the prior art circuit, transistors N9 and N10 function both as the current source for a pair of differentially connected transistors and to select which pair is enabled. Also, the amplitude of the clock signals applied to the gates of N9 and N10 need not be limited and can swing from ground to VDD. In addition there is no need for level shift transistors to couple the outputs of stage 12 to the inputs of stage 14. Still further, the use of P1 and P2 provides active current sources to drive the outputs high. For ease of illustration, the circuit of FIG. 2A may be represented in block form as shown in FIG. 2B.

Figure 3A:
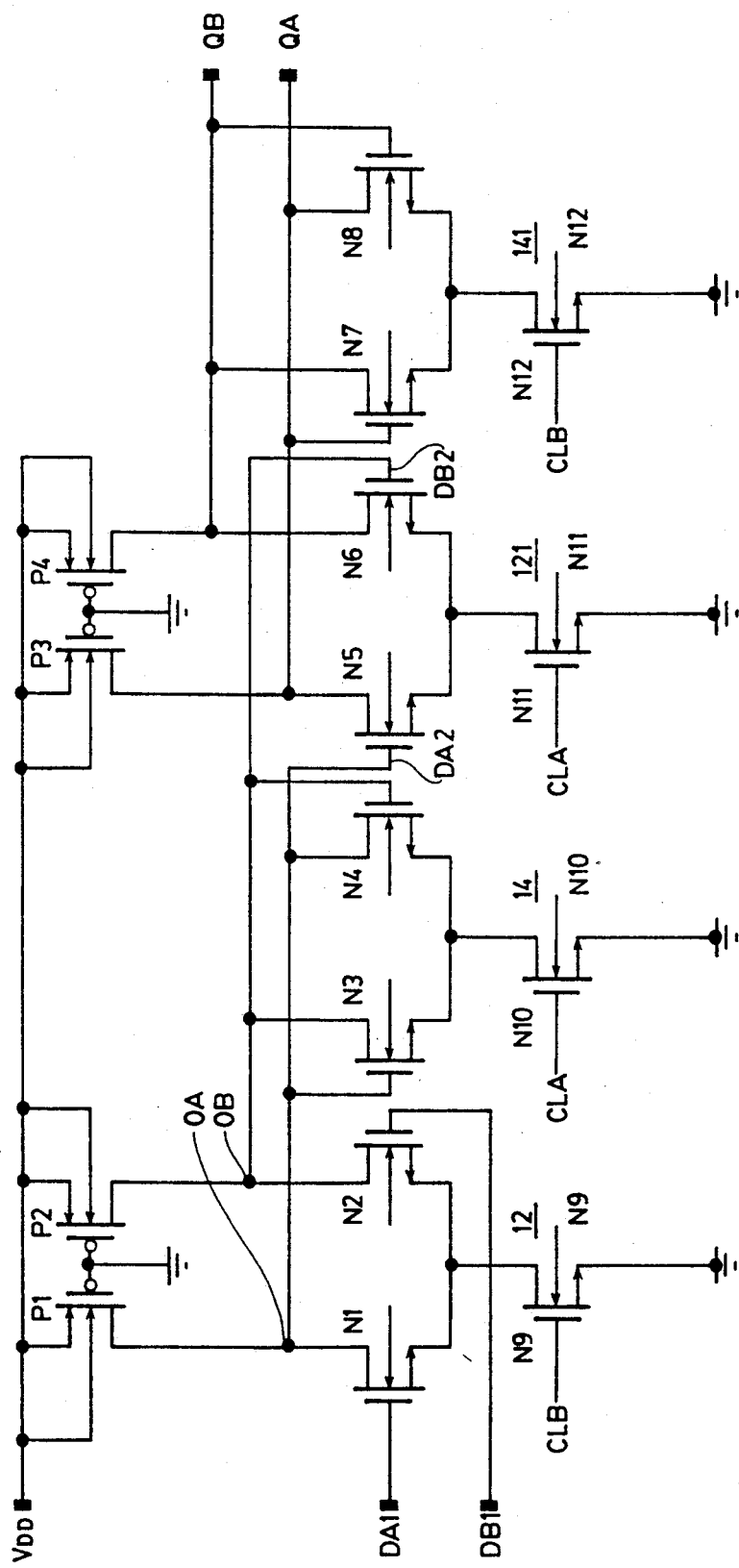
FIG. 3A is a schematic diagram of a CML flip-flop embodying the invention.
Figure 3B:
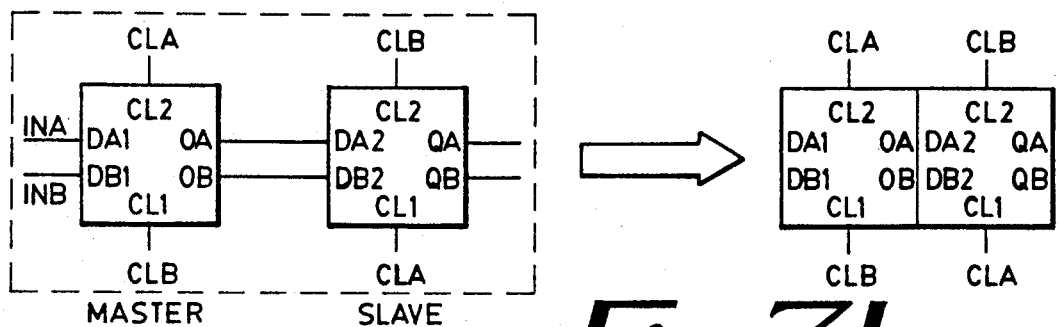
FIG. 3B is a block diagram representation of the circuit of FIG. 3A.

Stages 12 and 14 of FIG. 2A can be redrawn as stages 12 and 14 in FIG. 3A. In addition, stages 121 and 141, which are structurally identical to stages 12 and 14, respectively, can be interconnected with stages 12 and 14 to form a master-slave D-type flip flop as shown in FIG. 3A. In FIG. 3A, the inputs to stage 121 are defined as DA2 and DB2 and the outputs of stages 121 and 141 are defined as QA and QB. The inputs to stage 12 are defined as DA1 and DB1 and the outputs of stages 12 and 14 are OA and OB. Stages 12 and 141 are controlled by CLB and stages 14 and 121 are controlled by CLA. This clocking arrangement enables the sequential transfer and flow of data from stage to stage on suceeding phases of the clock signals. The explanation given for FIG. 2A applies and need not be repeated. For ease of illustration, the circuit of FIG. 3A may be represented in block diagram form as shown in FIG. 3B.

Figure 4:
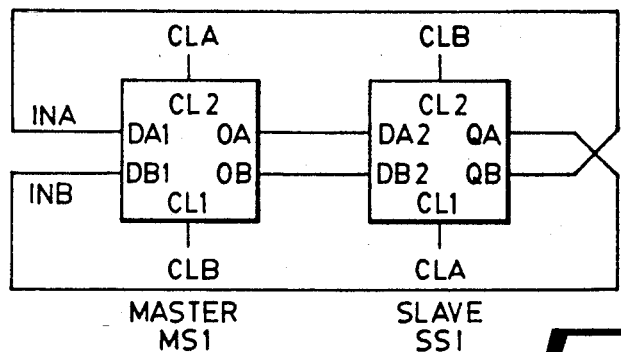
FIG. 4 is a divide-by-two CML circuit embodying the invention.

FIG. 4 shows that the outputs QA and QB of the circuit shown in FIG. 3A (or 3B) may be fed back to the inputs DB and DA, respectivley, to form a divide-by-two counter for use in various counting and division circuits. The output OA of the master stage MS1 (which is comprised of stages 12 and 14) is connected to the input DA2 of the slave stage SS1 (which is comprised of stages 121 and 141) and the output OB of MS1 is connected to input DB2 of SS1. The output of SS1 denoted as QA is connected to input DB1 of MS1 and the output of SS1 denoted as QB is connected to input DA1 of MS1. Clock signal CLB is applied to the differential input stage 12 of MS1 and to the cross-coupled stage 141 of SS1. Clock signal CLA is applied to the cross-coupled stage 14 of MS1 and to the differential input stage 121 of SS1.

The operation of the circuit of FIG. 4 will now be explained with reference to the circuit diagrams of FIGS. 3A and 3B and to the waveform diagrams of FIG. 5. Assume that at time t=0, OA is high and OB is low and that QA (applied to DB1) is low and QB (applied to DA1) is high. Assume also that at t=0, CLB goes high and CLA goes low. When CLB goes high, differential stage 12 is enabled and the high at DA1 causes OA to go from high to low and the low at DB1 causes OB to go from low to high. Since CLA is low, the cross-coupled stage 14 and the differential input stage 121 of SS1 are disabled. Thus, the changes in the state of OA and OB are not propagated during the clock phase when CLB is high and CLA is low.

At time t1, CLB goes low and CLA goes high. When CLB goes low, input stage 12 of MS1 and cross-coupled stage 141 of SS1 are disabled. Input stage 12 is then not responsive to changes at DA1 and DB1. When CLA goes high, cross-coupled stage 14 of MS1 and the input stage 121 of SS1 are enabled. Stage 14 latches and stores the low level at OA and the high level at OB and this information is applied to the inputs of stage 121 causing QA and QB to change state. This is shown for time t1 in FIG. 5. OA which is low is applied to DA2 and OB which is high is applied to DB2. This causes the output QA to go high and output QB to go low. Recall that since CLB is low, the change in QA and QB does not alter the state of input stage 12 until the next clock phase when CLB goes high.

Figure 5:
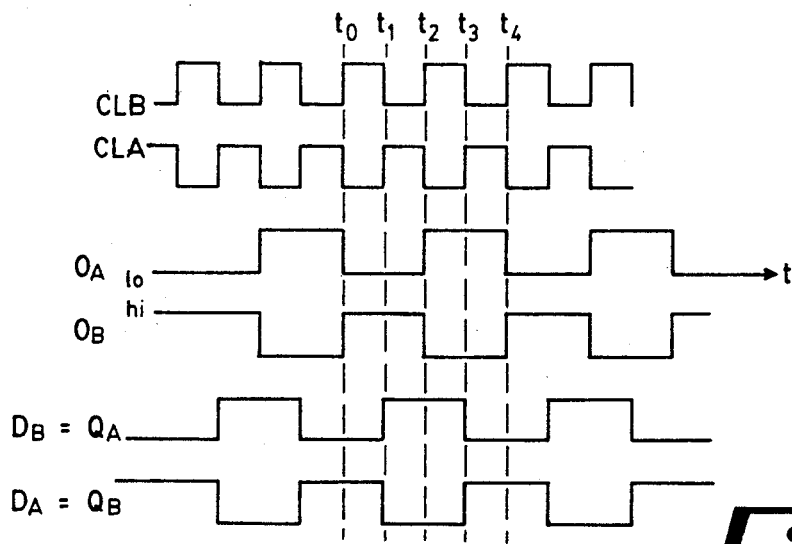
FIG. 5 is a diagram of waveforms associated with the circuit of FIG. 4.

As shown in FIG. 5, at time t2, CLA goes low and CLB goes high and stages 12 and 141 are again enabled while stages 14 and 121 are disabled. The change in QA and QB (i.e., QA-high and QB-low) gets latched into stage 141 while stage 12 is responsive to QA-high applied to DB1 and QB-low applied to DA1 which causes OA to go high and OB to go low.

This process repeats as the clock signals change levels. It is evident from an examination of the waveforms of FIG. 5 that OA, OB, QA and QB vary at a rate which is equal to one-half the rate of the input clock signals, CLA and CLB. It should be appreciated that where, for example, the input clock signal is in the order of 500 megahertz the circuit of the invention can provide accurate and reliable division of the clock. It should also be appreciated that circuits embodying the invention enable a very high frequency operation not achievable using standard complementary MOS Logic circuits.

Figure 6A:
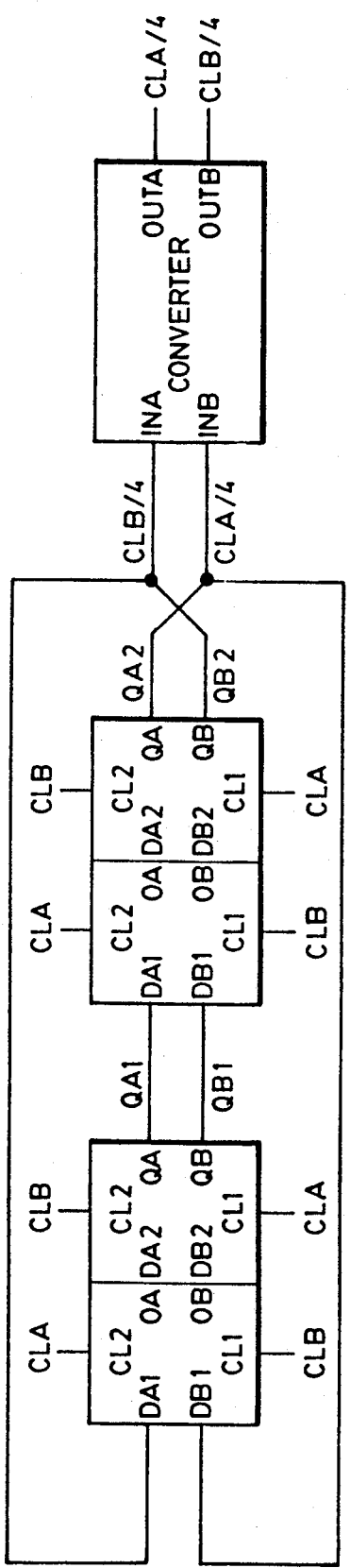
FIG. 6A is a divide-by-four counter using circuitry embodying the invention.
Figure 6B:
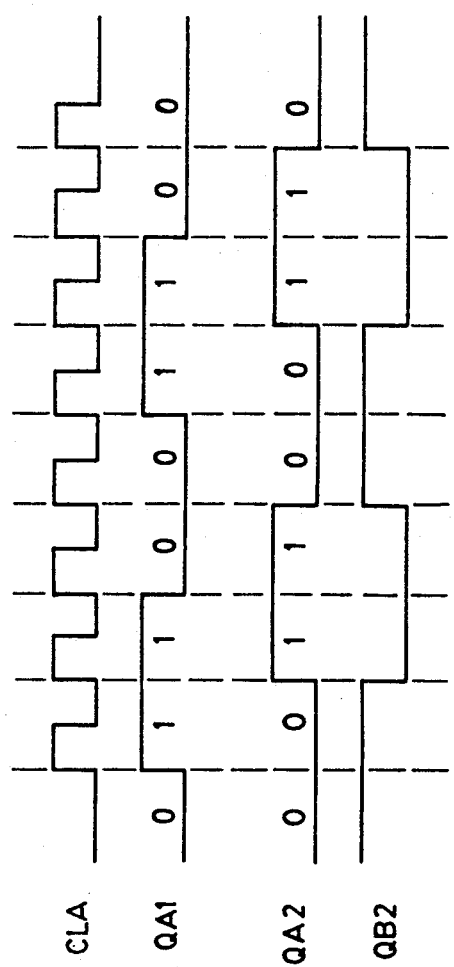
FIG. 6B is a diagram of waveforms associated with the circuit of FIG. 6A.

Circuit stages of the type shown in FIGS. 2 and 3 may be cascaded (i.e., the output of one stage may be connected to the input of the next) with the output of the last stage fed back to the input of the first stage to form counters which can divide by an even number. By way of example, FIG. 6A shows two stages interconnected to form a divide-by-four counter. The outputs QA1 and QB1 of the first stage are applied to the inputs DA1 and DB1 respectively of the second stage. The outputs QA2 and QB2 of the second stage are cross-coupled and applied to inputs DB1 and DA1 respectively of the first stage. The waveforms produced at various points of the counter are shown in FIG. 6B. In general, N stages of the type shown in FIG. 3 may be interconnected to form a divide-by-$2^N$ counter.

Figure 7A:
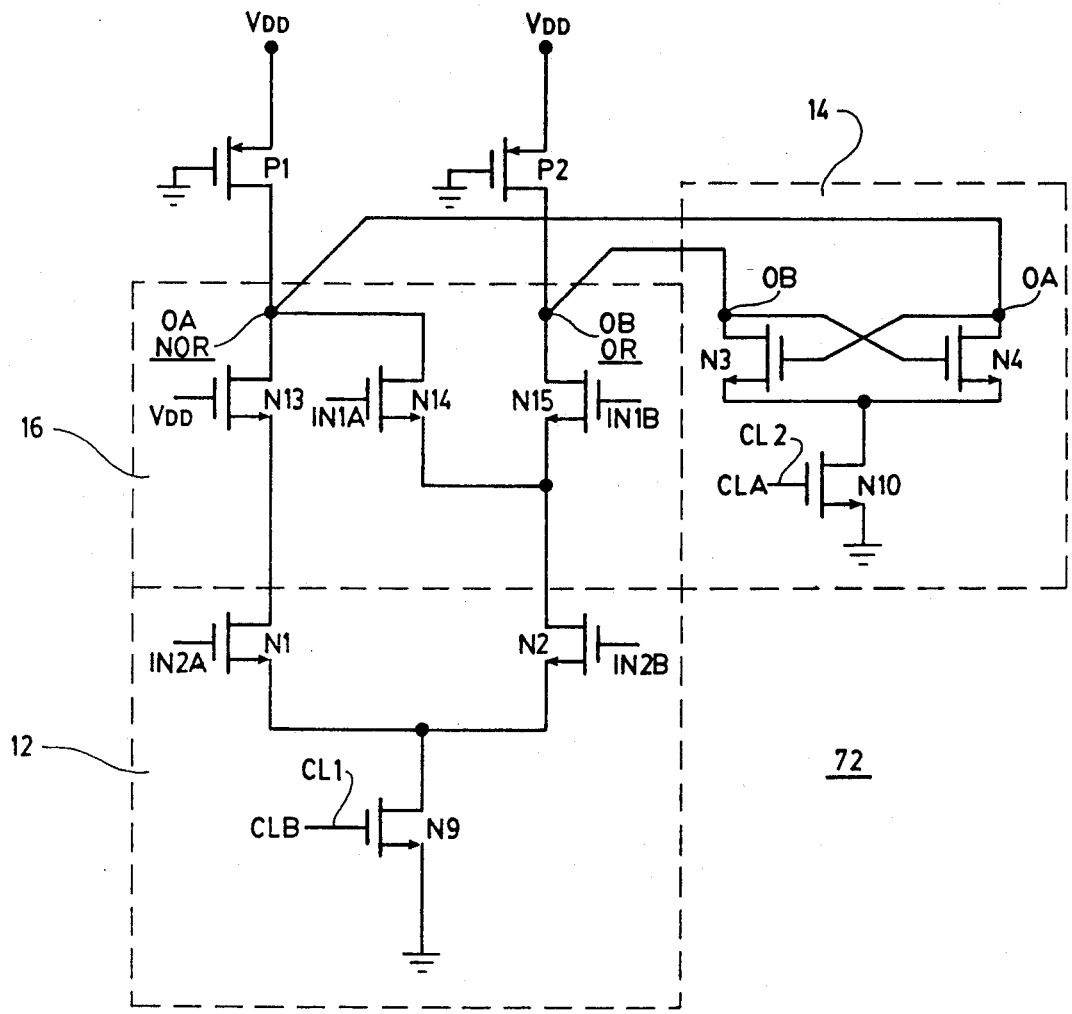
FIG. 7A is a schematic diagram of another input stage embodying the invention.

The circuit of FIG. 2 may be modified to enable combinatorial logic to be performed within the stage as shown in FIG. 7A. The circuit of FIG. 7A generates the "OR" and "NOR" functions of two inputs IN1 and IN2. The circuit of FIG. 7A (like that of FIG. 2A) includes an input differential stage 12 comprised of IGFETS N1, N2 and N9. In addition, a circuit 16 is connected between the drains of N1 and N2 and the outputs OA and OB. The circuit 16 includes the conduction path of an IGFET N13 which is connected between the drain of N1 and output OA. Also, a second differentially connected pair of transistors N14 and N15 have their sources connected in common to the drain of N2. The drain of N14 is connected to OA and the drain of N15 is connected to OB. Complementary input signals IN1A and IN1B are applied to the gate electrodes of N14 and N15 respectively and a fixed potential (e.g. VDD) is applied to the gate of N13. So biased, N13 functions to provide a voltage drop at OA of similar amplitude to that produced at OB due to N15. N13 helps to balance the signal levels at OA and OB but is not necessary for correct operation of the circuit. A cross-coupled differentially connected stage 14 (of the type shown in FIG. 2A) is connected to outputs OA and OB to selectively latch the data.

Figure 7B:
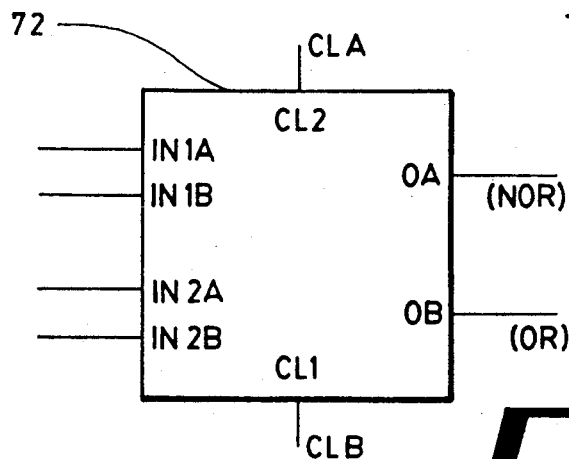
FIG. 7B is a block diagram representation of the circuit of FIG. 7A.

When CLB is "high", stage 12 is enabled. If IN2A is high and IN2B is low, N1 is ON and N2 is OFF. In response thereto, output OA goes "low" and output OB goes "high", regardless of the value of IN1A and IN1B. If IN2A is low and IN2B is high, N1 is OFF and N2 is ON. Now, if IN1A is "high" and IN1B is "low", N14 is ON and N15 is OFF and the output OA goes "low" and the output OB goes "high". On the other hand, if IN1A is "low" and IN1B is "high", N14 is OFF and N15 is ON and OA goes high while OB goes low. Thus OA goes "low" whenever IN2A or IN1A is "high" forming the "NOR" function; and OB goes "high" whenever IN2A or IN1A is "high", forming the "OR" function. The outputs generated at OA and OB are latched and stored by means of latch 14 when CLA goes high and CLB goes low. For ease of illustration, the circuit of FIG. 7A may be represented in block form as shown in FIG. 7B.

Figures 8A, 8B:
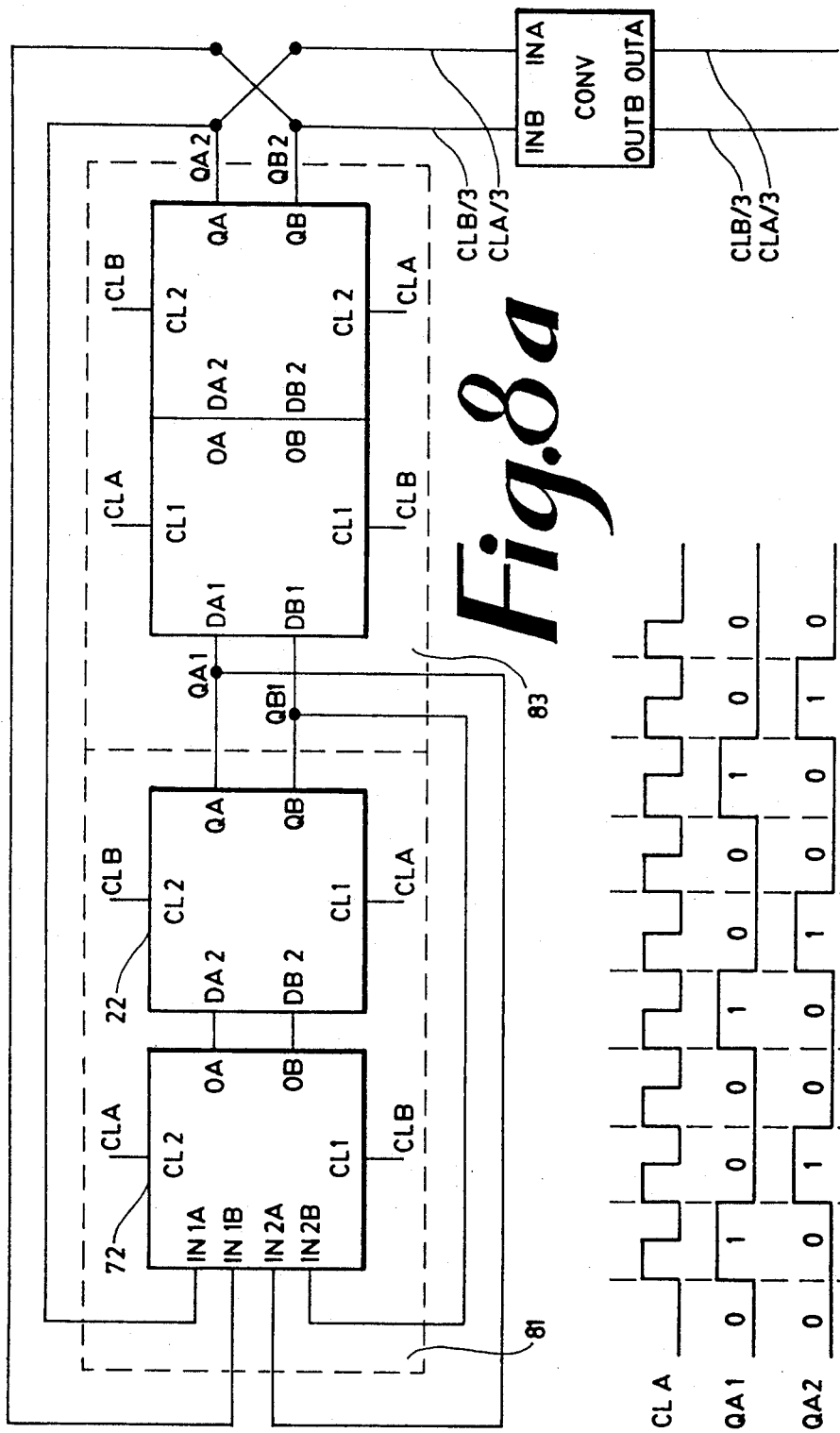
FIG. 8A is a divide-by-three counter using circuits embodying the invention.
FIG. 8B is a diagram of waveforms associated with the circuit of FIG. 8A.

The circuit of FIG. 7A may be interconnected with stages of the type shown in FIG. 2A to form counters which can divide by an odd number of counts. By way of example, a divide-by-three counter is shown in block form in FIG. 8A. The divide-by-three counter, like the divide-by-four counter, includes two master-slave stages. The outputs (QA1,QB1) of the first stage 81 are applied to the inputs (DA1, DB1) of the second stage 83 and the outputs (QA2,QB2) of the second stage 83 are fed back to the inputs (IN1A,IN1B) of the first stage 81. The circuit of FIG. 8A differs from the circuit of FIG. 6A in that the outputs (QA1,QB1) of the first stage 81 are fed back to the inputs (IN2A,IN2B) of the first stage. The signals at (QA1,QB1) are logically combined with the signals (QA2,QB2) at the input of the first stage to interrupt the normal sequence of the divide-by-four operation in order to implement the divide-by-three function. The waveforms produced at CLA, QA1 and QA2 are shown in FIG. 8B.

As noted above, the signal levels produced at the outputs of the high frequency circuits shown in FIGS. 2A and 3A, will vary betwen the power supply voltage level (i.e. VDD) and a voltage level which may be 1 volt to 4 volts below VDD. Operating the circuits with signals which do not swing between VDD and ground, enables higher frequency operation but normally also increases the power dissipation. In order to decrease the power dissipation and for interface considerations, it is desirable that the output signals swing from rail-to-rail (i.e. VDD to ground). Thus, to drive circuits on the same chip which are operated at a lower frequency and/or to operate circuits located off-chip, it is often desired that the amplitude of the signal outputs OA and OB or QA and QB be converted to signals ranging between VDD and ground. This may be achieved by means of converter circuitry of the type shown schematically in FIG. 9A and in block form in FIG. 9B.

Figure 9A:
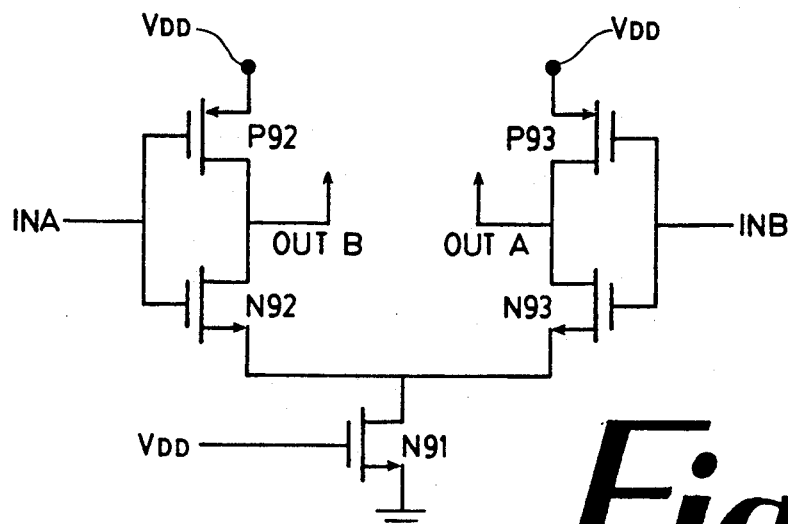
FIG. 9A is a schematic diagram of a converter circuit.

The circuit of FIG. 9A includes an IGFET N91 whose conduction path is connected between ground and the sources of differentially connected transistors N92 and N93. The drain of N92 is connected to the drain of P92 at output B (OUTB) and the drain of N93 is connected to the drain of P93 at output A (OUTA). The sources of P92 and P93 are returned to VDD. A fixed potential (e.g. VDD) is applied to the gate of N91 while an input signal INA is applied to the gates of P92 and N92 an the complement of that signal, INB, is applied to the gates of P93 and N93.

When INA is more positive than INB, N92 is on and N93 is off, OUTA will then rise towards VDD. Concurrently, the conduction through P92 is decreased, while the conduction through N92 is increased ensuring that OUT B is pulled down towards ground. Since N91 is biased on hard, its drain-to-source impedance is at a minimum. Conversely, when INB is more positive than INA, OUT A is driven low towards ground potential and OUT B is driven high towards VDD. In the operation of this type of circuit, the "high" signal is pretty close to VDD so that N92 and N93 are turned on hard and P92 and P93 are turned off when a "high" signal is applied to their gates.

Figure 9B:
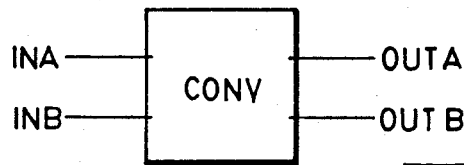
FIG. 9B is a block diagram representation of the circuit of FIG. 9A.

The converter circuit of FIG. 9A may be represented in block diagram form as shown in FIG. 9B. The converter circuit of FIG. 9 may be connected to the outputs of the counter stages as shown in FIGS. 6A and 8A to generate approximately full amplitude [i.e. VDD or ground] signals.

In the circuits of FIGS. 2A, 3A and 7A, the active transistors have been shown as N-type IGFETS and the load transistors have been shown as P-type IGFETS. It should be understood that the circuit function could be implemented with the N-type IGFETs replaced by P-type IGFETs and the P-type IGFETs replaced by N-type IGFETs with appropriate inversion of the power supplies (i.e. VDD and ground would be interchanged).

It should be appreciated that circuits embodying the invention enable a very high frequency operation not achievable using standard complementary MOS Logic circuits.

What is claimed is:

1. The combination comprising:
   first and second power terminals for the application therebetween of an operating potential;
   first and second inputs for the application thereto of complementary input signals;
   first and second outputs at which are produced complementary output signals in response to said input signals;
   first, second, third, fourth, fifth and sixth insulated-gate-field-effect transistors (IGFETs) of one conductivity type; each IGFET having source and drain electrodes defining the ends of a conduction path and a control electrode for controlling the conductivity of the path;
   means connecting the drain of the first IGFET to said first output, the drain of the second IGFET to said second output, and the sources of said first and second IGFETS in common and via negligible impedance means to the drain of the third IGFET;
   negligible impedance means connecting the drain of the fourth IGFET to said first output and the drain of the fifth IGFET to said second output and the sources of said fourth and fifth IGFETS in common to the drain of the sixth IGFET;
   negligible impedance means connecting the control electrode of said fourth IGFET to the drain of said fifth IGFET at said second output and the control electrode of said fifth IGFET to the drain of said fourth IGFET at said first output;
   negligible impedance means connecting the sources of said third and sixth IGFEs to said first power terminal;
   means connecting the control electrodes of said first and second IGFETs to said first and second inputs, respectively;
   means for applying control signals to the control electrodes of said third and sixth IGFETS for turning only one of them on at a time; and
   means coupling said first and second outputs to said second power terminal.

2. The combination as claimed in claim 1, wherein the means connecting the conduction path of said first IGFET to said first output include the conduction path of a seventh IGFET; and wherein the means connecting the conduction path of said second IGFET to said second output includes the conduction path of an eighth IGFET.

3. The combination as claimed in claim 2, further including a ninth IGFET having its conduction path connected between the first output and the drain of the second IGFET; and
   means for applying complementary signals to the control electrodes of said eighth and ninth IGFETs and a fixed potential to the control electrode of said seventh IGFET.

4. The combination comprising:
   first and second power terminals for the application therebetween of an operating potential;
   first and second inputs for the application thereto of complementary input signals;
   first and second outputs at which are produced complementary output signals in response to said input signals;
   first through sixth insulated-gate-field-effect transistors (IGFETs) of one conductivity type and seventh and eighth IGFETs of complementary conductivity type; each IGFET having source and drain electrodes defining the ends of a conduction path and a control electrode for controlling the conductivity of the path;
   means connecting the drain of the first IGFET to said first output, the drain of the second IGFET to said second output, and the sources of said first and second IGFETS in common to the drain of the third IGFET;
   means connecting the drain of the fourth IGFET to said first output and the drain of the fifth IGFET to said second output and the sources of said fourth and fifth IGFETS in common to the drain of the sixth IGFET;
   means connecting the control electrode of said fourth IGFET to the drain of said fifth IGFET and the control electrode of said fifth IGFET to the drain of said fourth IGFET;
   means connecting the control electrodes of said first and second IGFETs to said first and second inputs, respectively;
   means connecting the sources of said third and sixth IGFETs via negligible impedance means to said first power terminal;
   means for applying control signals to the control electrodes of said third and sixth IGFETS for turning only one of them on at a time; and
   means connecting the conduction path of said seventh IGFET between said first output and said second power terminal and the conduction path of said eighth IGFET between said second output and said second power terminal.

5. The combination as claimed in claim 4, wherein the means connecting the conduction path of said first IGFET to said first output include the conduction path of a ninth IGFET; and wherein the means connecting the conduction path of said second IGFET to said second output includes the conduction path of a tenth IGFET.

6. The combination as claimed in claim 5, further including an eleventh IGFET having its conduction path connected between the first output and the drain of the second IGFET; and
   means for applying complementary signals to the control electrodes of said tenth and eleventh IGFETs and a fixed potential to the control electrode of said ninth IGFET.

7. The combination comprising:
   first and second stages, each stage having first and second inputs and first and second outputs;
   means connecting the first output of the first stage to the first input of the second stage, and the second output of the first stage to the second input of the second stage;
   each one of said first and second stages including;
   (a) first, second, third, fourth, fifth and sixth insulated gate field effect transistors (IGFETs); each IGFET having source and drain electrodes defining the ends of a conduction path and a control electrode for controlling the conductivity of the path;

(b) means connecting the drain of said first IGFET to said first output and the drain of said second IGFET to said second output and the sources of said first and second IGFETs to the drain of said third IGFET;

(c) means connecting the drain of said fourth IGFET to said first output, and the drain of said fifth IGFET to said second output, and the sources of said fourth and fifth IGFETs to the drain of said sixth IGFET;

(d) means connecting the control electrodes of said first and second IGFETs to said first and second inputs, respectively;

(e) means connecting the sources of said third and sixth IGFETs via negligible impedance means to a point of fixed operating potential; and means for applying control signals to the control electrodes of said third and sixth IGFETs for turning only one of them on at a time; said means also including means for turning-on together the third IGFET of the first stage and the sixth IGFET of the second stage and for turning-on together the sixth IGFET of the first stage and the third IGFET of the second stage.

8. The combination as claimed in claim 7, wherein the means connecting the conduction path of said first IGFET of said first stage to said first output includes the conduction path of a ninth IGFET; and wherein the means connecting the conduction path of said second IGFET of said first stage to said second output includes the conduction path of a tenth IGFET.

9. The combination as claimed in claim 8, further including an eleventh IGFET having its conduction path connected between the first output and the drain of said second IGFET of said first stage.

10. The combination comprising:

first and second input terminals and first and second output terminals;

first, second, third, fourth, fifth and sixth IGFETs, each one of said IGFETs having a source and a drain defining the ends of a conduction path and a control electrode;

means connecting the conduction path of said first IGFET between said first output terminal and a first node and the conduction path of said second IGFET between said second output terminal and said first node;

means connecting the conduction path of said third IGFET between said first node and a first power terminal;

means connecting the control electrode of said first IGFET to said first input terminal and the control electrode of said second IGFET to said second input terminal;

means connecting the conduction path of said fourth IGFET between said first output terminal and a second node and the conduction path of said fifth IGFET between said second output terminal and said second node;

means connecting the conduction path of said sixth transistor between said second node and said first power terminal;

means connecting the control electrode of said fourth IGFET to said second output terminal and the control electrode of said fifth IGFET to said first output terminal; and means for applying signals to the control electrodes of said third and sixth IGFETs for turning-on said third IGFET and turning-off said sixth IGFET during one time interval, and for turning-off said third IGFET and turning-on said sixth IGFET during a subsequent time interval.

11. The combination comprising:

an input differential stage having first and second inputs and first and second outputs and a control terminal for the application thereto of a control signal which, when of one value, enables the differential stage whereby the signals produced at the outputs are responsive to the signals applied to the inputs and which, when of another value, disables the differential stage;

a cross-coupled differential stage having first and second input/output terminals, the first and second input/output terminals being connected respectively to the first and second outputs of the input differential stage; and said cross-coupled differential stage having a control terminal for the application thereto of a control signal, said control signal for enabling said cross-coupled differential stage and storing the signals at said first and second outputs when said input differential stage is disabled; and wherein said input differential stage includes three insulated gate field effect transistors (IGFETs) of one conductivity type, wherein said cross-coupled differential stage includes three IGFETs of the same one conductivity type, and wherein IGFETs of complementary conductivity type supply currents to said first and second outputs.

* * * * *